(12) United States Patent
Guenter et al.

(10) Patent No.: US 11,393,615 B2
(45) Date of Patent: Jul. 19, 2022

(54) METHOD FOR CHARGING AN HTS SHIM DEVICE AND MAGNET ARRANGEMENT

(71) Applicant: Bruker Switzerland AG, Faellanden (CH)

(72) Inventors: Kenneth J. Guenter, Zurich (CH); Robert Schauwecker, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 424 days.

(21) Appl. No.: 16/705,815

(22) Filed: Dec. 6, 2019

(65) Prior Publication Data
US 2020/0185136 A1    Jun. 11, 2020

(30) Foreign Application Priority Data
Dec. 10, 2018  (DE) ...................... 10 2018 221 322.4

(51) Int. Cl.
*H01F 6/06*      (2006.01)

(52) U.S. Cl.
CPC ...................................... *H01F 6/06* (2013.01)

(58) Field of Classification Search
CPC ... H01F 6/06; H01F 6/008; H01F 6/00; G01R 33/3815; G01R 33/3875
See application file for complete search history.

(56) References Cited

U.S. PATENT DOCUMENTS 5,965,959 A * 10/1999 Gamble .................. H01F 6/005
                                                       335/216
6,014,069 A     1/2000 Havens et al.
(Continued)

FOREIGN PATENT DOCUMENTS

DE    102015218019 A1    3/2017
DE    102016225017 A1    6/2018
(Continued)

OTHER PUBLICATIONS

Iwasa et al., "Persistent-mode high-temperature superconductor shim coils: a design concept and experimental results of a prototype Z1 high-temperature superconductor shim", Applied Physics Letters 103, (2013), 3 pages.
(Continued)

*Primary Examiner* — G. M. A Hyder
(74) *Attorney, Agent, or Firm* — Edell, Shapiro & Finnan, LLC

(57) ABSTRACT

A method for charging an HTS shim device in a cryostat having a room temperature bore using a charging device. A shim switch temporarily interrupts the superconducting state in a section of an HTS shim conductor path. The charging device includes a primary circuit with a normal-conducting charging coil and the conductor path forms a secondary circuit. A current change in the secondary circuit results from a change in magnetic flux generated by the charging coil through the secondary circuit. In a first phase the shim switch is opened to interrupt the superconducting state in a section of the conductor path, the charging coil is positioned in the bore, and the current in the primary circuit is changed; in a second phase, the conductor path is superconductingly closed; in a third phase, the current in the primary circuit is changed and/or the charging coil is removed from the bore.

18 Claims, 5 Drawing Sheets

(56) References Cited

U.S. PATENT DOCUMENTS

| | | |
|---|---|---|
| 8,965,468 B2 | 2/2015 | Iwasa |
| 9,671,479 B2 | 6/2017 | Blakes |
| 9,766,311 B2 | 9/2017 | Wikus et al. |
| 9,810,755 B2 | 11/2017 | Shen et al. |
| 2006/0066429 A1* | 3/2006 | Kasten ............... G01R 33/3815 335/296 |
| 2015/0168517 A1* | 6/2015 | Shen .................... G01R 33/385 324/322 |
| 2018/0164388 A1 | 6/2018 | Guenter et al. |
| 2020/0161039 A1* | 5/2020 | Hinderer .......... G01R 33/34023 |
| 2021/0302520 A1* | 9/2021 | Guenter ................... H01F 6/06 |

FOREIGN PATENT DOCUMENTS

| | | |
|---|---|---|
| GB | 2424284 A | 9/2006 |
| WO | 2007004787 A2 | 1/2007 |

OTHER PUBLICATIONS

Geng et al., "Mechanism of a high-Tc superconducting flux pump: Using alternating magnetic field to trigger flux flow", Applied Physics Letters 107, (2015), 4 pages.

Coombs et al., "Flux pumps for HTS coils", Magnetics Technology International, 2017, 6 pages.

Lee et al., "Persistent Current Mode Operation of a 2G HTS Coil With a Flux Pump" IEEE Transactions on Applied Superconductivity, vol. 26, No. 4, Jun. 2016, 4 pages.

Bumby et al., "Through-Wall Excitation of a Magnet Coil by an External-Rotor HTS Flux Pump", EEE Transactions on Applied Superconductivity, vol. 26, No. 4, Jun. 2016, 5 pages.

Park et al., "HTS Shim Coils Energized by a Flux Pump for the MIT 1.3-GHz LTS/HTS NMR Magnet: Design, Construction, and Results of a Proof-of-Concept Prototype" IEEE Transactions on Applied Superconductivity, vol. 28, No. 3, Apr. 2018, 5 pages.

* cited by examiner

METHOD FOR CHARGING AN HTS SHIM DEVICE AND MAGNET ARRANGEMENT

CROSS REFERENCE TO RELATED APPLICATIONS

This application claims foreign priority under 35 U.S.C. § 119(a)-(d) to German Application No. DE 10 2018 221 322.4 filed on Dec. 10, 2018, the entire contents of which are hereby incorporated into the present application by reference.

FIELD OF THE INVENTION

The invention relates to a method for charging an HTS (=high-temperature superconductor) shim device of a superconducting magnet coil system arranged in a cryostat having a room temperature bore using a charging device, the HTS shim device comprising at least one superconductingly closed HTS shim conductor path and a shim switch for temporarily interrupting the superconducting state in a section of the HTS shim conductor path. The invention also relates to a magnet arrangement for carrying out the method according to the invention.

BACKGROUND

An HTS shim device and a method for charging the HTS shim device are described in [03]. Superconductingly closed HTS coils are known, for example, from [01], [02], [03] and [09] and can be used in magnet coil systems as main magnet or parts thereof for generating the main magnetic field.

For charging superconducting coils, which are used as main magnets in a magnet coil system, different charging methods are known. According to [05], [06], [07], [08] and [10], for example, flux pumps can be used to charge main magnets. By using a flux pump, the charging process is divided into several cycles. However, this is associated with a long charging time.

[12] discloses a charging method for an MRI main magnet in which a primary circuit comprises a first coil whose power supply is connected in parallel to a first switch. Parallel to the first coil, a second coil is connected, which can be connected via a second switch. In one embodiment the first coil may be arranged in the cryostat. The second coil is always located outside the cryostat, i.e. in a room temperature environment, and is inductively coupled to the main coil. However, even after passing through several charging ramps with the method described in [12] no appreciable increase in current in the main magnet can be achieved.

From [13] there is known a magnet arrangement having a main magnet including both LTS (=low-temperature superconductor) coils and an HTS coil, wherein the HTS coil is charged by inductive coupling with the LTS coils.

In particular, HTS coils are also used as shim coils to homogenize the main magnetic field because HTS material shim coils can improve the field homogeneity of HTS main magnets whose operating fields or temperatures do not allow the use of LTS material for shim coils. In particular, superconductingly closed shim coils made of HTS-coated conductor paths [01], [02], [03] have the advantage that they can carry persistent currents, i.e. no power supply unit is required to maintain the electric currents. These coils are charged via a direct connection to a power supply unit. For this purpose, the superconducting shim circuit is interrupted by opening a superconducting switch. The current is fed into the shim circuit by the power supply unit, which is connected in parallel to the superconducting switch. After closing the superconducting switch, the current in the shim circuit runs persistently and the current from the power supply unit is reduced. Due to their low inductance, persistent shim coils made of HTS-coated conductor paths typically require significantly larger electric currents to generate a certain field strength than wound shim coils having multiple turns. The charging method known from [03] therefore has the disadvantage that the correspondingly large-dimensioned current leads conduct much heat from the outside in the cryostat. In addition, the high currents in the at least partially normal-conducting leads generate additional Joule heat during the charging process. In a bath-cooled cryostat this leads to a faster evaporation of the cryogen bath. An actively cooled cryostat requires the use of a cryocooler with correspondingly higher cooling capacity.

[11] discloses an arrangement having a shim coil, which is inductively charged by the main magnet, so that the heat input via power supply lines is eliminated.

Due to the special topology of the HTS-coated conductor paths (as opposed to shim coils wound of wires), a good inductive decoupling between several such conductor paths is virtually impossible, which makes it difficult to charge multiple shim coils. In [04], a superconducting magnet arrangement and a charging method are disclosed, which allow a simultaneous charging of inductively coupled shim coils via a common power supply line. However, the electric circuit requires special, low temperature semiconductor switches (e.g. MOSFETs) and additional measuring resistors for controlling the final currents. The wiring through the additional signal and control cables and the control of the shim coils are quite complex. In addition, a time-accurate switching of the superconducting switch, which is necessary for a precise current adjustment, is very difficult to accomplish.

SUMMARY

It is therefore an object of the invention to propose a method for charging persistent HTS shims, in which the heat input in the cryostat can be prevented and at small material expense an effective charging of the HTS shim conductor paths with definite electric target currents is possible. In addition, a magnet arrangement having a charging device is proposed, with which the HTS shim device can be charged.

DESCRIPTION OF THE INVENTION

According to the invention, the charging device comprises a normal-conducting charging coil, at least one power supply and supply lines and forms at least one primary circuit. The HTS shim device comprises an HTS shim conductor path and a shim switch and forms a secondary circuit. In the secondary circuit, a change of the electric current (secondary current change) is carried out inductively with a change in the magnetic flux generated by the charging coil through the area enclosed by the HTS shim conductor path, wherein in a first phase in any order the shim switch for interrupting the superconducting state is at least temporarily opened in a section of the HTS shim conductor path, the charging coil is positioned in the room temperature bore of the cryostat and at least a change in the electric current in the primary circuit is carried out. In a second phase, the HTS shim conductor path is superconductingly closed by closing the shim switch. In a third phase, when the shim switch is closed, the electric current in the primary circuit is changed and/or the charging coil is removed from the room temperature bore. The changes of the electric current in the primary circuit in the first and third phases are called primary current adjustments in the following. By virtue of the method, the magnetic field of the HTS shim device charged in this way is superimposed on the magnetic field of a main magnet of the magnet coil system such that the spatial progression and/or the spatial homogeneity of the magnetic field generated by the magnet coil system in a working volume are adjusted.

According to the method of the invention, the HTS shim device is inductively charged. For this purpose, a normal-conducting charging coil is used, which is arranged in the room temperature bore of the cryostat. This prevents—apart from the heat of the shim switch—a heat input in the cryostat. The charging coil is powered by a power supply located outside the cryostat. The positioning of the charging coil in the room temperature bore is preferably carried out by inserting the charging coil in the room temperature bore in the first phase or in that the charging coil was not removed from the room temperature bore in a previous charging process.

When the shim switch is opened, the secondary circuit remains electrically short-circuited, but becomes normal-conducting or resistive in the region of the shim switch. This can be done for example by increasing the temperature in the region of the shim switch. Alternatively or additionally, the superconducting secondary circuit can also be interrupted by generating a strong magnetic field or an alternating electromagnetic field in the region of the shim switch. When the shim switch is closed, the secondary circuit is superconductingly closed.

The feeding of the current into the secondary circuit, i.e. the actual charging process, takes place in the third phase with the shim switch closed. In this case, the current in the secondary circuit is set inductively as a result of a change in the magnetic flux generated by the charging coil through the area enclosed by the HTS shim conductor.

The first phase serves to adjust the magnetic flux which, after the second or before the third phase, penetrates the surface enclosed by the superconductingly closed HTS shim conductor. This magnetic flux is given by the product of the mutual inductance between the charging coil and the HTS shim conductor path and the electric current (primary current) flowing in the charging coil. Thus, for example, with a primary current adjustment in the first phase, the magnetic flux may be set to the value which, upon complete removal of this flux (by completely discharging and/or removing the charging coil from the room temperature bore) with the shim switch closed in the third phase to induce the desired target current in the HTS shim conductor path. Optionally, in the first phase additionally a primary current adjustment for controlled discharging of the secondary circuit (see below) can be performed.

The electric target currents that must flow in the shim coils in order to achieve a desired magnetic field distribution in the working volume of a magnet coil system are usually determined as follows. Firstly, with a magnetic field sensor (e.g. Hall sensor or NMR probe), the magnetic field generated by the main magnet is measured with regard to the working volume. Then, based on the geometry of the shim coils, it is calculated with which electric currents the various shim coils generate a magnetic field which adapts or corrects the measured magnetic field with regard to the working volume as desired.

Preferably, in the third phase, the primary current is reduced to 0 and/or the charging coil is completely removed from the room temperature bore.

Preferably, in the first phase, the shim switch is opened before causing a change in the magnetic flux at the location of the secondary circuit (by introducing the energized (charged with current) charging coil into the room temperature bore or by adjusting (changing) the electric current in the primary circuit). In this way it is avoided that already in the first phase current is induced in the secondary circuit, which would lead to a heat dissipation when opening the shim switch.

There are usually several ways to position the charging coil axially in the room temperature bore and to achieve a sufficiently strong inductive coupling with the HTS shim conductor. Preferably, a position is chosen in which the polarity of the primary current in the charging coil during the charging process is predominantly such that the stray magnetic field of the charging coil is opposite to the magnetic field at the location of the coils of the main magnet. This ensures that the superconducting main magnet does not become more critical during charging of the HTS shim device, i.e. its superconducting current carrying capacity is not reduced.

Preferably, the charging coil is removed from the room temperature bore after charging so that the space is available for other components such as room temperature shims or a probe head needed for the measurements to be performed in the device.

In a preferred variant of the method according to the invention the current in the primary circuit is increased for adjusting the electric current in the primary circuit in the first phase, and the current in the primary circuit is reduced to adjust the electric current in the primary circuit in the third phase. This variant is advantageous, in particular, when the primary current in the first phase is increased from 0 A and is reduced to 0 A in the third phase, so that the charging coil is de-energized after the charging process and a supply by a power supply is no longer required.

It is particularly advantageous if, in order to discharge the secondary circuit in the first phase while the secondary circuit is superconductingly closed, the current in the charging coil is set such that the current in the secondary circuit drops to 0. The previous complete discharge of the HTS shim conductor path is advantageous, since otherwise the energy stored in the HTS shim conductor path would be dissipated as heat via the electric resistance of the later open shim switch.

Preferably, this discharging process is the only primary current adjustment in the first phase in which the shim switch is closed.

In a specific variant of the method according to the invention, at least one of the changes in the electric current in the primary circuit takes place in the first phase after the shim switch has been opened. The charging of the secondary circuit can then take place in the third phase by a primary current adjustment with opposite signs, in particular by reducing the primary current to 0 or by removing the energized charging coil (charged with current) from the room temperature bore.

In a particularly preferred variant, the HTS shim device comprises n>1 HTS shim conductor paths, which each form a secondary circuit with one shim switch each, the HTS shim conductor paths of the secondary circuits being inductively coupled.

Firstly, a sequence of switch openings and switch closures of the shim switches of the secondary circuits and a sequence of changes in the electric current in the primary circuit are determined. In this case, a change in the electric current in the primary circuit is performed after each last closure of the shim switch of a secondary circuit within the predetermined sequence, wherein the extents of the changes in the electric current to be performed in the primary circuit for the predetermined sequence of processes are calculated so that the sum of all currents in each secondary circuit induced by the changes in the electric current in the primary circuit and by the switch openings corresponds to a target current, wherein the inductive couplings between the HTS shim conductor paths with one another and between the charging coil and the HTS shim conductor paths are taken into account.

Traditionally, inductively coupled HTS shim conductor paths are charged simultaneously because, in a sequential charging method, entering a current into one of the HTS shim conductor paths would also alter the currents in the coupled other HTS shim conductor paths. In contrast, according to the invention, the HTS shim conductor paths are sequentially charged (switch openings, closures of the various secondary circuits and primary current adjustments are performed according to a predetermined sequence), wherein during a secondary current change in an HTS shim conductor path, the current in another HTS shim conductor path can change due to the inductive coupling. According to the invention, the inductive coupling of the HTS shim conductor paths with one another and the associated current changes in the coupled HTS shim conductor paths are taken into account in the calculation of the primary current adjustments. In particular, this variant allows the charging of several secondary circuits with a single charging coil.

Preferably, after the shim switch of a secondary circuit within the sequence has been closed for the last time, a change in the electric current in the primary circuit is performed before the shim switch of another secondary circuit within the sequence is closed for the last time. In this way, it is ensured that the system of equations to be solved for the calculation of the magnitudes of the primary current adjustments has a solution.

Preferably, within the sequence, the shim switches of those secondary circuits are first closed for the last time, whose HTS shim conductor paths are least strongly inductively coupled to other HTS shim conductor paths. This minimizes coupling effects.

In a specific variant, the changes in the electric current in several primary circuits with m>1 different charging coils, which are inductively coupled to the HTS shim conductor paths are performed. Thus, the primary current adjustments can be performed for example in charging coils, which couple particularly strongly with certain HTS shim conductor paths.

The invention also relates to a magnet arrangement adapted to carry out the method described above, comprising: a cryostat having a room temperature bore; a superconducting magnet coil system arranged in the cryostat having a main magnet and having an HTS shim device having at least one HTS shim conductor path for adjusting the spatial profile and/or for spatial homogenization of a magnetic field generated by the magnet coil system in a working volume, the HTS shim conductor path being as a superconducting short-circuitable HTS coil having a winding number of 0 around a main magnet longitudinal axis, said HTS shim device comprising a shim switch for temporarily interrupting the superconducting state in a section of the HTS shim conductor path. According to the invention, the magnet arrangement comprises a charging device having at least one normal-conducting charging coil, at least one power supply and supply lines, which together form a primary circuit, wherein the charging coil is arranged in the room temperature bore of the cryostat or can be temporarily arranged, wherein the HTS shim conductor path and the shim switch form a secondary circuit, wherein the charging coil and the HTS shim conductor path are adapted to inductively couple with each other.

Preferably, the current transfer ratio $|M/L_s|$ between the charging coil and the HTS shim conductor path is $\geq 0.01$, in particular $\geq 1$, wherein M denotes the mutual inductance between the charging coil and the HTS shim conductor path and $L_s$ the self-inductance of the HTS shim conductor path. A current transfer ratio of these orders ensures that the charging coil does not have to be operated with excessive electric currents and that a correspondingly simple power supply can be used.

The HTS coil of the HTS shim device is present in the form of a closed HTS shim conductor path whose superconducting state can be interrupted by the superconducting shim switch. The HTS shim conductor path comprises an HTS layer and forms a superconductingly closed coil having a winding number of 0 (with respect to the main magnet longitudinal axis).

The cryostat of the magnet arrangement comprises, if it is bath-cooled, a helium container having an outer jacket and an inner tube, between which liquid helium is located. The HTS shim conductor path is preferably arranged on the inside of the helium container inner tube of the cryostat (i.e. radially inside the helium container), so that the HTS shim conductor path is in the vacuum volume and is cooled by contact with the helium container.

The charging coil may be formed as a solenoid coil. Preferably, the charging coil is wound of an electrically highly conductive material, in particular of copper wire.

Due to the arrangement of the charging coil in the room temperature bore of the cryostat according to the invention no power supply lines from the power supply at room temperature to the cryostat are needed. This eliminates the associated heat input in the cryostat completely. In addition, no space for the charging coil and the supply lines must be provided in the cryostat.

The charging coil has a charging coil longitudinal axis, which is preferably aligned at least in the third phase parallel to the main magnet longitudinal axis, in particular coaxially to the main magnet longitudinal axis (i.e. charging coil longitudinal axis=main magnet longitudinal axis). This embodiment is particularly advantageous since the coupling between the charging coil and the HTS shim conductor path can be optimized if they have the same symmetry, the same axis of symmetry or parallel axes of symmetry. This is the case since the HTS shim conductor path usually runs on a cylinder surface with the main magnet longitudinal axis as the axis of symmetry. As a result of a stronger coupling, the charging coil can then be operated with smaller currents.

In a particular embodiment, the HTS shim device has a plurality of secondary circuits, the HTS shim conductor paths of at least two different secondary circuits being adapted to inductively couple with the same charging coil. The charging coil thus forms a common charging coil for several secondary circuits. Preferably, the HTS shim conductor paths of all secondary circuits of the HTS shim device are configured to inductively couple with the same charging coil. The use of a single charging coil for charging the entire HTS shim device is particularly advantageous when the space in the room temperature bore is limited.

In an alternative embodiment, the HTS shim device has a plurality of secondary circuits and the charging device has a plurality of charging coils, wherein the different charging coils are adapted to inductively couple with respectively different HTS shim conductor paths of the various secondary circuits. This allows simultaneous charging of several secondary circuits.

In a particular embodiment, the charging device comprises a magnetic field sensor which is arranged radially inside the charging coil. Preferably, the magnetic field sensor is adapted to measure the magnetic field in the working volume of the magnet coil system. The magnetic field sensor may be, for example, a Hall sensor or an NMR probe. Thus, on the one hand, the magnetic field of the magnet coil system with the still uncharged HTS shim device can be measured in order to determine the required target currents of the HTS shim conductor paths. On the other hand, the effect of the HTS shim device on the magnetic field of the magnet coil system during and after the charging process can be checked.

In a further advantageous embodiment, a shim switch comprises an electric heating element in which a heating current can be induced by inductive coupling with a primary coil in the room temperature bore of the cryostat. This embodiment has the advantage that the shim switch can be operated without electric supply lines from the outside in the cryostat and consequently without the associated heat input in the cryostat.

Further advantages of the invention will become apparent from the description and the drawings. Likewise, according to the invention, the above-mentioned features and those which are still further developed can each be used individually for themselves or for a plurality of combinations of any kind. The embodiments shown and described are not to be understood as exhaustive enumeration, but rather have exemplary character for the description of the invention.

DETAILED DESCRIPTION

Figure 1:
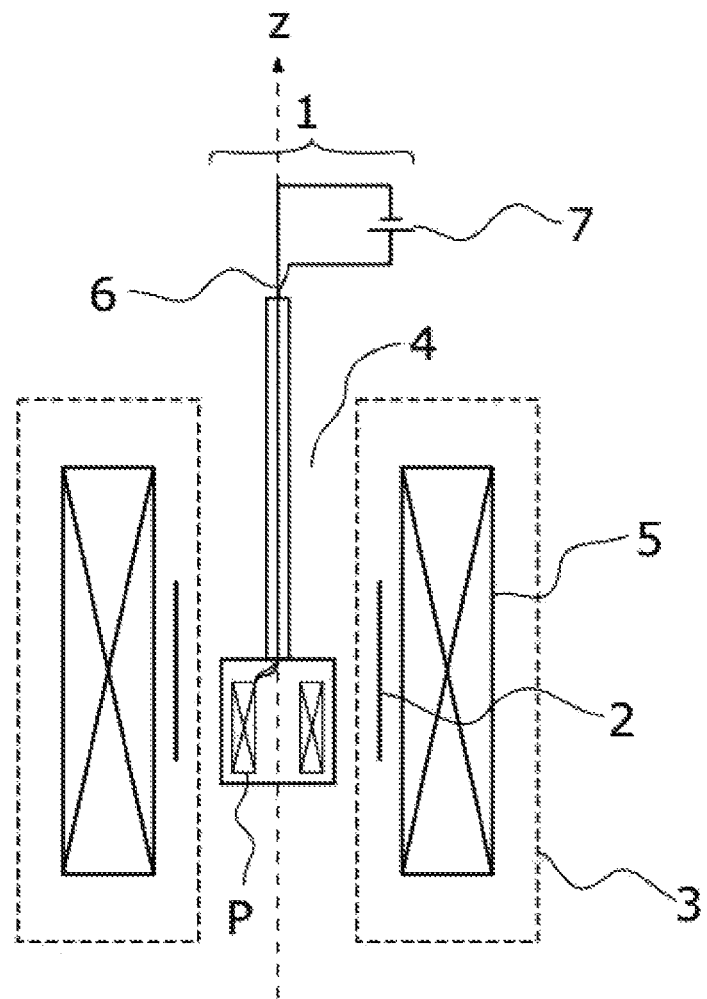
FIG. 1 shows a magnetic arrangement according to the invention.

The magnet arrangement according to the invention is shown in FIG. 1. It comprises a cryostat 3 with a room temperature bore 4. In the cryostat 3 a main magnet 5 for generating a main magnetic field having a main magnet longitudinal axis z and an HTS shim device 2 for adaptation or homogenization of the main magnetic field is positioned. For charging the HTS shim device 2, a charging device 1 is provided, with which the HTS shim device 2 can be charged inductively. The charging device 1 comprises a charging coil P, which can be energized through supply lines 6 by a power supply 7. The charging coil P is arranged for charging within the room temperature bore 4 (as shown in FIG. 1), so that the charging coil P can optimally couple with the HTS shim device 2. The charging process of the HTS shim device 2 is carried out inductively.

Figure 2:
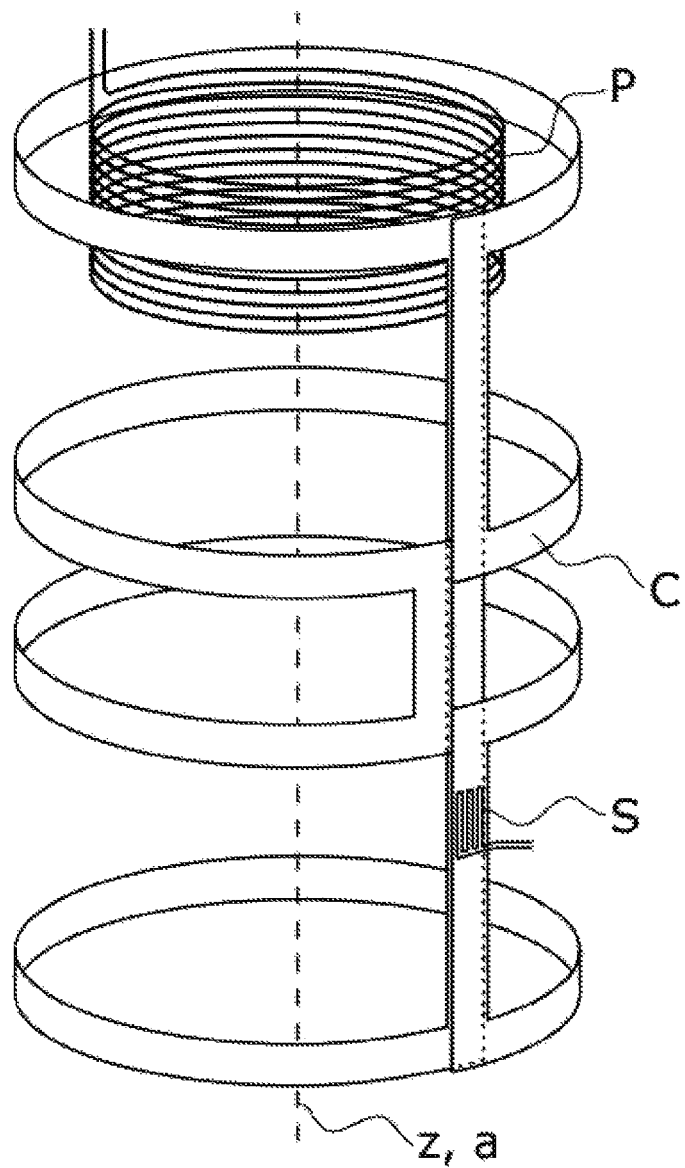
FIG. 2 shows a perspective view of an HTS shim device and a charging coil of a magnet arrangement according to the invention and according to a first embodiment in which the HTS shim device comprises a single secondary circuit and is arranged coaxially to the charging coil.

FIG. 2 shows a preferred relative arrangement of the HTS shim device 2 and the charging coil P. For the sake of clarity, the cryostat 3 is not shown in FIG. 2. From FIG. 2 it can be seen that the HTS shim device 2 is designed as a closed HTS shim conductor path C, which is provided with a shim switch S, with which the superconductingly closed secondary circuit of the HTS shim conductor path C can be interrupted. The charging coil P has a charging coil longitudinal axis a, which preferably coincides with the main magnet longitudinal axis z during the charging process. After charging, the charging coil P can be removed from the room temperature bore 4 (not shown in FIG. 2).

The charging coil P, the supply lines 6 and the power supply 7 form a primary circuit and the HTS shim device 2 a secondary circuit, the charging coil P being inductively coupled to the HTS shim conductor path C. The inductive coupling between the charging coil P and the HTS shim conductor path C is dependent on the position of the charging coil P within the room temperature bore 4.

The HTS shim device 2 of the magnet arrangement according to the invention is charged using a charging method according to the invention. The time sequence of the individual steps of the charging method according to the invention is shown schematically for an HTS shim conductor path C in FIG. 3 (without discharging the secondary circuit in the first phase Ph1) and FIG. 4 (with discharging of the secondary circuit in the first phase Ph1).

Figure 3:
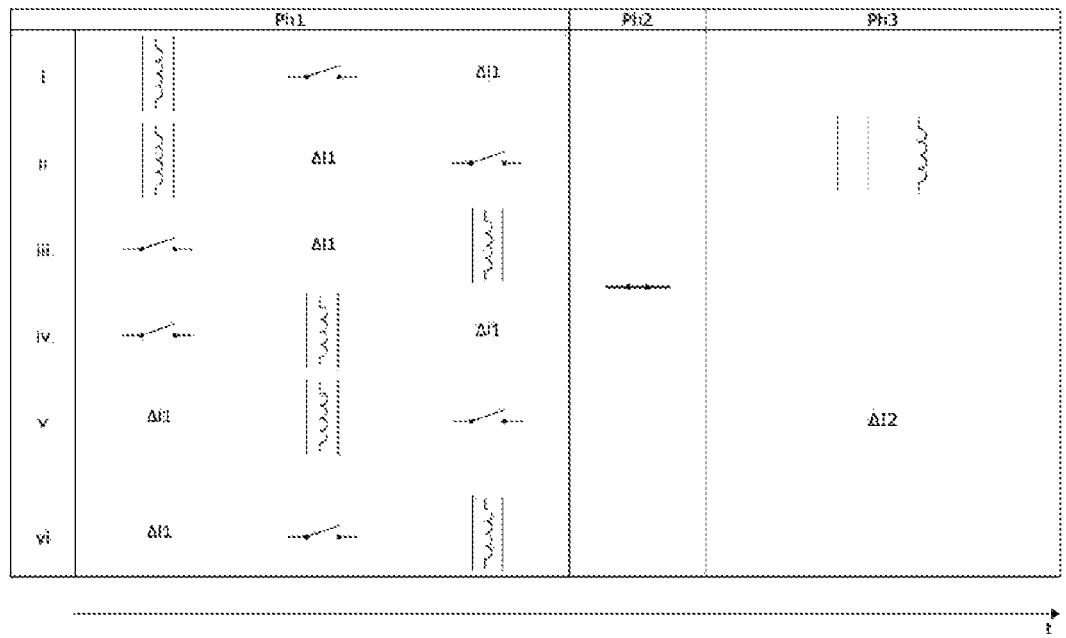
FIG. 3 shows schematically the various steps of the charging method according to the invention without discharging a secondary circuit in the first phase.

Firstly, the primary circuit and the secondary circuit are prepared for charging (first phase Ph1). For this purpose, the charging coil P is placed in the room temperature bore 4 of the magnet coil arrangement (represented by a coil within a longitudinal pipe section), and using the power supply 7, a first primary current change $\Delta I1$ and optionally a discharge current change $\Delta I0$ is performed in the charging coil P (energizing the charging coil P). In the secondary circuit, the shim switch S is opened (represented by a switch symbol with opened switch). The different possibilities of performing the steps of the first phase Ph1 are shown in FIG. 3 and designated by i-vi.

Figure 4:
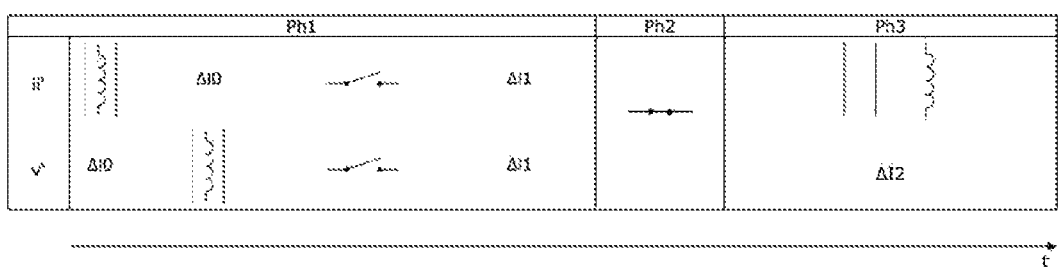
FIG. 4 shows schematically the various steps of the charging method according to the invention with discharging a secondary circuit in the first phase.

By energizing the charging coil P previously placed in the room temperature bore 4 (i, ii iv) or by introducing the charging coil P already charged with current in the room temperature bore 4 (iii, v, vi) a change of the magnetic flux is caused at the location of the secondary circuit. If this is done in the first phase Ph1 with closed shim switch S in the secondary circuit, this can be used to inductively discharge the secondary circuit before the shim switch S is opened, as shown in FIG. 4 (ii', v'). For the secondary circuit to be completely discharged, a discharge current change $\Delta I0$ is performed in the charging coil P before opening the shim switch S, which causes a reduction to 0 of the current in the secondary circuit. The energization of the charging coil P with the first a current change $\Delta I1$ then occurs after the opening of the shim switch S.

If a discharge of the secondary circuit is not necessary or desired, the shim switch S in the secondary circuit is preferably opened before a change of the magnetic flux is caused. For this purpose, the insertion of the charging coil P and/or the energizing of the charging coil P is carried out after the opening of the shim switch S (i, iii, iv, vi).

In a second phase Ph2, the shim switch S is closed (represented by a switch symbol with closed switch), so that the secondary circuit is superconductingly closed again.

In a third phase Ph3, by changing the current in the primary circuit by $\Delta I2$ and/or by removing the charging coil P from the room temperature bore 4 (represented by a coil outside a longitudinal tube section), the magnetic flux through the HTS shim conductor path C is changed so that current is induced in the secondary circuit. The magnitude of the primary current adaptation $\Delta I2$ in the charging coil P depends on the current that is to flow in the secondary circuit after charging and after the inductive coupling between the HTS shim conductor path C and the charging coil P. The first current change $\Delta I1$ in the first phase Ph1 preferably corresponds to the magnitude of the primary current adaptation $\Delta I2$ in the third phase Ph3, but has the opposite sign.

Instead of a single HTS shim conductor path C, the HTS shim device 2 according to the invention can comprise a plurality of (n>1) inductively coupled HTS shim conductor paths $C_1, \ldots, C_n$, each of which forms a secondary circuit with one shim switch each $S_1, \ldots, S_n$. In the charging method, a charging device 1 having a single charging coil P (FIG. 5) or a charging device 1' having a plurality of charging coils $P_1, \ldots, P_m$ (FIG. 6) can be used.

For each of the HTS shim conductor paths $C_1, \ldots, C_n$, the phases Ph1, Ph2, Ph3 (first, second and third phase) are consecutively traversed, wherein the first phase Ph1 and the third phase Ph3 may comprise a plurality of primary current adjustments. Primary current adjustments of the third phase Ph3 are for an HTS conductor path $C_1, \ldots, C_n$ those primary current adjustments which occur after the last closure of the shim switch $S_1, \ldots, S_n$ of the respective secondary circuit. Depending on the fact in which secondary circuits the shim switch $S_1, \ldots, S_n$ is closed for the last time (i.e. the last time within the sequence), a certain primary current adjustment may belong to the third phase Ph3 of the charging process for an HTS conductor path $C_1, \ldots, C_n$ (when the shim switch $S_1, \ldots, S_n$ is closed for the last time) and to the first phase Ph1 of the charging process for another HTS shim conductor path $C_1, \ldots, C_n$ (if the shim switch $S_1, \ldots, S_n$ will be opened again later).

The calculation of the primary current adjustments for n coupled HTS shim conductor paths $C_1, \ldots, C_n$ is performed as follows:

1. In order to calculate the primary currents for an HTS shim device 2 having a plurality of secondary circuits, a sequence must first be predetermined during which the shim switch $S_1, \ldots, S_n$ of each secondary circuit is opened and closed at least once. At the end of the sequence all shim switches $S_1, \ldots, S_n$ are closed. A total of at least n primary current adjustments are performed in the charging coil(s) P, $P_1, \ldots, P_m$, having at least one shim switch $S_1, \ldots, S_n$ being opened or closed between two primary current adjustments. Two temporally offset current changes in the charging coil P, $P_1, \ldots, P_m$ without a change of a shim switch position is considered in the context of the present invention as a single primary current adjustment.

2. For each change in a shim switch position, the secondary current changes are calculated as a function of the primary current adjustments performed so far.

With a switch closure, the currents in the secondary circuits do not change.

In the case of a switch opening, the current in the corresponding HTS shim conductor path $C_1, \ldots, C_n$ drops to 0 A, which in turn induces current changes in all HTS shim conductor paths $C_1, \ldots, C_n$ closed at this time. These current changes can be calculated as linear functions of the magnitudes of the previously performed primary current adjustments.

In the HTS shim conductor paths $C_1, \ldots, C_n$ having open shim switches $S_1, \ldots, S_n$ the current remains at 0.

In the case of a primary current adjustment, secondary current changes are induced in all HTS shim conductor paths $C_1, \ldots, C_n$ which are closed at this time. These can be calculated as linear functions of this primary current adjustment.

3. For each HTS shim conductor path $C_1, \ldots, C_n$ the secondary current changes calculated under point 2 are added up for all processes within the sequence and they are equated to the target or final current in this HTS shim conductor path $C_1, \ldots, C_n$. This yields n equations which are solved for the magnitudes of the at least n primary current adjustments. If the equations do not have a solution, the sequence was chosen unfavorably.

If more than n primary current adjustments have been performed, the additional primary current adjustments may be used to satisfy additional conditions for the currents in the primary and secondary circuits.

In the following it is shown by way of example how n HTS shim conductor paths $C_1, \ldots, C_n$ of the magnet arrangement according to the invention can be charged inductively with a charging device 1 having a charging coil P, and the necessary primary current adjustments are calculated, so that at the end of the charging sequence each HTS shim conductor path $C_j$ (j=1, \ldots, n) carries a predetermined electric target current $I_j$. First, analytical formulas are derived from a concrete charging method. Afterwards it will be explained which changes result in the calculation of a more general charging sequence.

Figure 5:
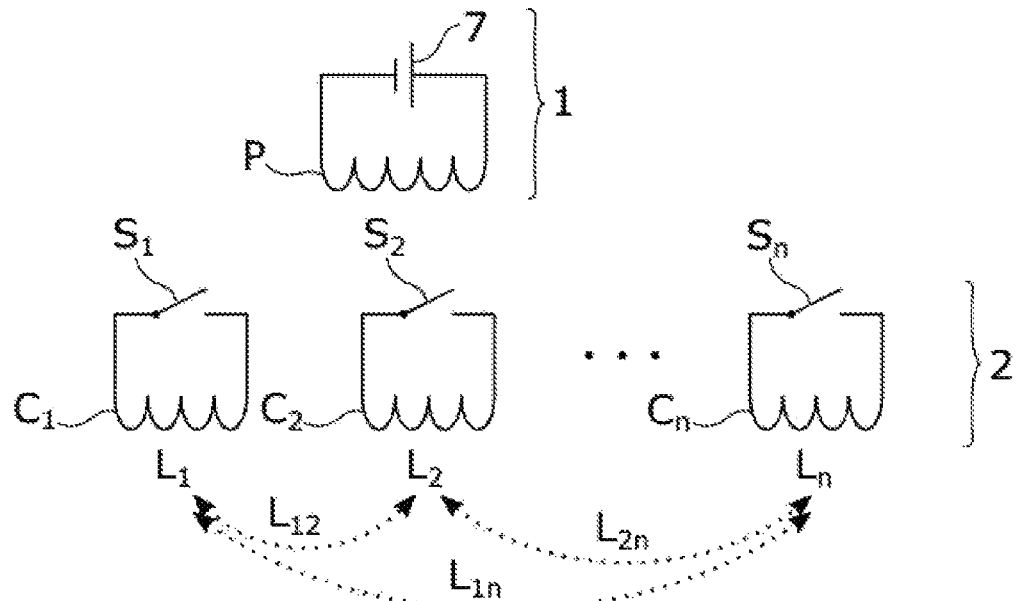
FIG. 5 shows an electric circuit diagram of an HTS shim device and a charging device of a magnet arrangement according to the invention according to an embodiment in which the HTS shim device comprises a plurality of inductively coupled secondary circuits, which can be charged by a shared charging coil.

FIG. 5 shows an electric circuit diagram of n≥1 inductively coupled HTS shim conductor paths $C_1, \ldots, C_n$ each forming its own superconducting closed circuit. The HTS shim conductor paths $C_1, \ldots, C_n$ are preferably arranged coaxially to each other (not shown in FIG. 5), wherein the HTS shim conductor paths are not necessarily rotationally symmetrical. Each HTS shim conductor path $C_j$ is equipped with a shim switch $S_j$, which can be used to interrupt the superconducting circuit. There is also a charging coil P, which is fed by a power supply 7 and inductively coupled to the HTS shim conductor paths $C_1, \ldots, C_n$.

Charging Sequence

The charging sequence, which is calculated as an example below, runs in n+1 steps (0), \ldots (n):

(0) All shim switches $S_1, \ldots, S_n$ are opened, so that the secondary current circuits of the HTS shim conductor paths $C_1, \ldots, C_n$ carry no current. The current in the charging coil P is driven to a value $\Delta I_0^{(0)}$.

(i) For i=1, \ldots, n, two successive processes are performed:
(a) The shim switch $S_i$ is closed (and not opened in the further process);
(b) The current in the charging coil P is changed by the value $\Delta I_0^{(i)}$.

In process (b) secondary current changes are induced in the superconducting closed HTS shim conductor paths $C_1, \ldots, C_n$. Firstly, these secondary current changes are calculated as a function of the primary current adjustments in the charging coil P. Thereafter, the primary current adjustments are determined, which must be performed in the individual steps, so that at the end of the charging process each HTS shim conductor path $C_j$ carries a desired target current $I_j$.

Induced Current Changes

This section considers a single step (i):

By the primary current adjustment $\Delta I_0^{(i)}$ in the charging coil P, the 'external' magnetic fluxes through the HTS shim conductor paths $C_1, \ldots, C_i$ with closed shim switches $S_1, \ldots, S_i$ change in process (b), described by the flux change vector $$\Delta \phi^{(i)} = \Delta \phi_1^{(i)}, \ldots, \Delta \phi_i^{(i)})^T = L_0^{(i)} \Delta I_0^{(i)} \text{ with } L_0^{(i)} = (L_{01}, \ldots, L_{0i})^T \quad (1)$$

The vector components $L_{01}, \ldots, L_{0i}$ describe the inductive couplings or mutual inductances between the charging coil P and the HTS shim conductor paths $C_1, \ldots, C_i$. Due to flux conservation, these external flux changes are compensated by induced currents in the superconductingly closed secondary circuits. The relationship between flux changes and induced secondary current changes is described by the (i×i)—inductivity matrix $\hat{L}^{(i)}$, wherein the matrix elements $L_{jk} = L_{kj}$ (j, k=1, . . . , i) represent the self-inductances (j=k) and the mutual inductances (j≠k) of the HTS shim conductor $C_1, \ldots, C_i$ paths:

$$\hat{L}^{(i)} \Delta I^{(i)} = -\Delta \phi^{(i)} \quad (2)$$

Here, is $\Delta I^{(i)} = (\Delta I_1, \ldots, \Delta I_i)^T$ the current change vector. By inverting equation (2), the induced current changes in the superconductingly closed secondary circuits can be expressed as a function of the primary current adjustment in the charging coil P, $$\Delta I^{(i)} = -\hat{L}^{(i)-1} L_0^{(i)} \cdot \Delta I_0^{(i)}. \quad (3)$$

Note that the secondary circuits of the HTS shim conductor paths $C_{i+1}, \ldots, C_n$ having open shim switches $S_{i+1}, \ldots, S_n$ carry no current until the end of step (i), i.e. $\Delta I_{j>i}^{(i)} = 0$.

Calculation of Primary Current Adjustments

The currents in the HTS shim conductor paths $C_1, \ldots, C_n$ at the end of the process generally result from the sums of the inductive secondary current changes of all steps, $$\Sigma_{i=1}^{n} \Delta I_j^{(i)} = I_j \text{ for}(j=1, \ldots, n) \text{ or in vector-shape} \Sigma_{i=1}^{n} \Delta I^{(i)} = I, \quad (4)$$

and will be equated to the target currents $I_1, \ldots, I_n$ of the HTS shim conductor paths $C_1, \ldots, C_n$. The n linear scalar equations can then be solved using equation (3) for the n primary current adjustments $\Delta I_0^{(i)}$. The very first primary current adjustment by $\Delta I_0^{(0)}$ in the charging coil P does not affect the currents in the secondary circuits, and can be chosen so that the current $I_0$ in the charging coil P at the end of the process is equal to 0:

$$I0 = \Sigma_{i=0}^{n} = 0 \Delta I_0^{(i)} = 0 \text{ or, respectively} \Delta I_0^{(0)} = -\Sigma_{i=1}^{n} \Delta I_0^{(i)}. \quad (5)$$

For the concrete example described here in which the shim switch $S_j$ is open in each case up to step (j−1) and the HTS shim conductor path $C_j$ carries no current up to this point in time, equation (4) can be written as $$I_j = \Sigma_{i=j}^{n} \Delta I_j^{(i)} \text{ or } \Delta_j^{(i)} = I_j - \Sigma_{k=j+1}^{n} \Delta I_j^{(k)} (\text{for } j=1, \ldots, n). \quad (6)$$

The last inductive secondary current change in the HTS shim conductor path $C_n$ must therefore be equal to its target current $$\Delta I_n^{(n)} = I_n. \quad (7)$$

The magnitude of the corresponding necessary primary current adjustment in the charging coil P is obtained through the equation (3), $$\Delta I_0^{(n)} = -\frac{I_n}{\sum_{j=1}^{n} (L^{(n)-1})_{nj} L_{0j}^{(n)}}. \quad (8)$$

The further secondary current changes and the necessary primary current adjustments can be calculated in this way in succession for each HTS shim conductor path $C_{n-1}, C_{n-2}, \ldots, C_1$ backwards according to the formula (6).

Several Charging Coils $P_1, \ldots, P_m$

Figure 6:
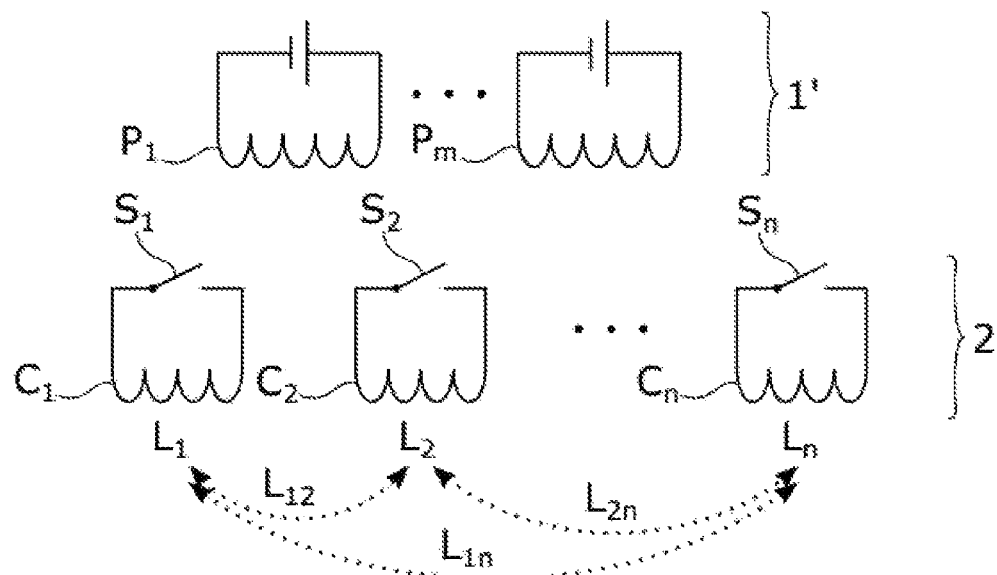
FIG. 6 shows an electric circuit diagram of an HTS shim device and a charging device of a magnet arrangement according to the invention according to an embodiment in which the HTS shim device comprises a plurality of inductively coupled secondary circuits, which can be charged by a plurality of charging coils.

Instead of a single charging coil P, m different charging coils $P_1, \ldots, P_m$ can also be used in the charging steps, as shown in FIG. 6. In equation (3), the couplings $L_0^{(i)}$ between the charging coil $P_1, \ldots, P_m$ and the HTS shim conductor paths $C_1, \ldots, C_n$ must then be calculated accordingly. In step (0) of the charging sequence the primary current in each charging coil $P_1, \ldots, P_m$ can be adjusted with open shim switches $S_1, \ldots, S_n$ so that the primary currents at the end of the sequence can reach a certain value, e.g. 0 A, see equation (5).

Additional Switch Openings and Closures

The shim switch $S_j$ to an HTS shim conductor path $C_j$ can be closed from the beginning or closed in a step (i<j). In the calculation of the primary current adjustments, all HTS shim conductor paths having closed shim switches must be considered in equation (3).

If the shim switch $S_j$ is opened again in a step (i≤j), the current in the secondary circuit of the HTS shim conductor path $C_j$ drops to 0, whereby the currents in the other closed secondary circuits change inductively. These secondary current changes can be calculated analogously to the case of a primary current adaptation in the charging coil P, $P_1, \ldots, P_m$ described above, and must be taken into account in equations (4) as additional summands. The number of equations and the unknown $\Delta I_0^{(i)}$ remains n, so that a clear mathematical solution can also be found in this case.

Additional Current Ramps

Before or after each additional change of a switch state (as described above), in principle, an additional primary current adjustment can be performed which influences the currents in the superconductingly closed secondary circuits. This opens up new options in terms of solving the problem so that generally there is more than one solution for the primary current adjustments in order to achieve the specified target currents for the HTS shim conductor paths $C_1, \ldots, C_n$. This fact can be exploited to meet additional conditions. For example, an additional primary current adjustment may be chosen so that the induced current in a secondary circuit goes to 0 before its shim switch is opened. Such additional primary current adjustments can be handled analogously to the calculations described above.

Example: HTS Shim Device 2 Having Two HTS Shim Conductor Paths $C_1$ and $C_2$ and Initially Closed Shim Switches $S_1$ and $S_2$ As an example of a more general charging sequence with additional switching processes and current ramps, two coupled HTS shim conductor paths $C_1$ and $C_2$ with initially closed shim switches $S_1$, $S_2$ and one charging coil P are considered. Allegedly, the electric currents in the two HTS shim conductor paths $C_1$ and $C_2$ as well as in the charging coil P are 0 at the beginning. The charging allegedly proceeds as follows:
1. The shim switch $S_1$ of the secondary circuit with the HTS shim conductor path $C_1$ is opened, the primary current in the charging coil P is adjusted by $\Delta I_0^{(1)}$;
2. The shim switch $S_1$ is closed, the primary current in the charging coil P is adjusted by $\Delta I_0^{(2)}$;
3. The shim switch $S_2$ of the secondary circuit with the HTS shim conductor path $C_2$ is opened, the primary current in the charging coil P is adjusted by $\Delta I_0^{(3)}$;
4. The shim switch $S_2$ is closed, the primary current in the charging coil P is adjusted by $\Delta I_0^{(4)}$.
The sequence comprises a total of four primary current adjustments in the charging coil P.
According to these four degrees of freedom four conditions can be defined:
B1: The final current in the HTS shim conductor path $C_1$ should be $I_1$.
B2: The final current in the HTS shim conductor path $C_2$ should be $I_2$.
B3: The HTS shim conductor path $C_2$ should not carry any current before the switch opening in step (3).
B4: The charging coil P should not carry any current at the end of the sequence.

Note that without B3, the HTS shim conductor path $C_2$ would experience a secondary current change to 0, which in turn would induce a secondary current change at the switch opening in the superconductingly closed HTS shim conductor path $C_1$. B1-B4 give the following equations, wherein the indices refer to the charging sequence described in this section:

$$\Delta I_1^{(1)}+\Delta I_1^{(2)}+\Delta I_1^{(3)}+\Delta I_1^{(4)}=I_1 \quad (9)$$

$$\Delta I_2^{(1)}+\Delta I_2^{(2)}+\Delta I_2^{(3)}+\Delta I_2^{(4)}=I_2 \quad (10)$$

$$\Delta I_2^{(1)}+\Delta I_2^{(2)}=0 \quad (11)$$

$$\Delta I_0^{(1)}+\Delta I_0^{(2)}+\Delta I_0^{(3)}+\Delta I_0^{(4)}=0 \quad (12)$$

From the charging sequence, it follows immediately that $\Delta I_1^{(1)}=0$ and $\Delta I_2^{(3)}=0$, since the shim switch $S_1$ in the 1st step and the shim switch $S_2$ in the 3rd step are opened during the respective primary current adjustment. The further induced secondary current changes $\Delta I_{1,2}^{(j)}$ (j=1, ..., 4) can be expressed by equation (3) by the primary current adjustment $\Delta I_0^{(1, ..., 4)}$. The equations (9-12) can thus be resolved:

$$\Delta I_0^{(1)} = \frac{L_1 L_2}{L_{01}L_2 - L_{02}L_{12}} \cdot I_1 + \frac{L_2 L_{12}}{L_{01}L_2 - L_{02}L_{12}} \cdot I_2 \quad (13)$$

$$\Delta I_0^{(2)} = \frac{L_{02}L_1(L_1 L_2 - L_{12}^2)}{(L_{01}L_{12} - L_{02}L_1)(L_{01}L_2 - L_{02}L_{12})} \cdot I_1 + \frac{L_{02}L_{12}(L_1 L_2 - L_{12}^2)}{(L_{01}L_{12} - L_{02}L_1)(L_{01}L_2 - L_{02}L_{12})} \cdot I_2 \quad (14)$$

$$\Delta I_0^{(3)} = -\frac{L_1 L_{12}}{L_{01}L_{12} - L_{02}L_1} \cdot I_1 - \frac{L_1 L_2}{L_{01}L_{12} - L_{02}L_1} \cdot I_2 \quad (15)$$

$$\Delta I_0^{(4)} = \frac{L_1 L_2 - L_{12}^2}{L_{01}L_{12} - L_{02}L_1} \cdot I_2 \quad (16)$$

Figure 7:
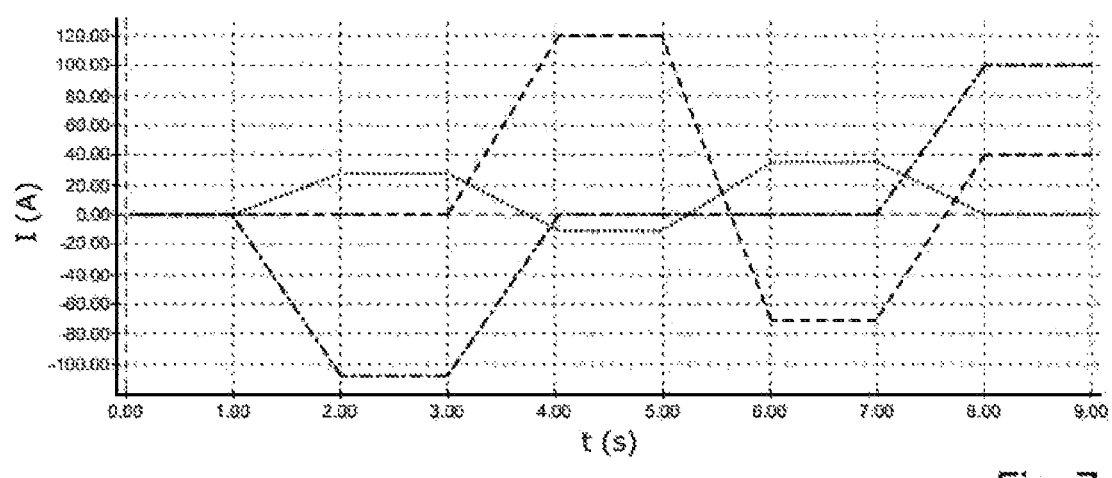
FIG. 7 shows an example of the current curves in the charging coil (dotted) and in two HTS shim conductor paths (dashed and dash-dotted).

An example of the temporal current curves for this charging sequence is shown for the target currents $I_1$=40 A and $I_2$=100 A in FIG. 7. In the example shown, the shim switch $S_1$ is opened at t=0 s and closed at 2.5 s. The shim switch $S_2$ opens at 4.5 s and closes at 6.5 s. It is easy to see that all four conditions B1-B4 are met.

LIST OF REFERENCE NUMBERS 1, 1' charging device
2 HTS shim device
3 cryostat
4 room temperature bore
5 main magnet
6 supply lines
7 power supply
a charging coil longitudinal axis
C, $C_1$, ..., $C_n$ HTS Shim conductor paths
P, $P_1$, ..., $P_m$ charging coils
Ph1 first phase
Ph2 second phase
Ph3 third phase
S, $S_1$, ..., $S_n$ shim switch
z main magnet longitudinal axis

BIBLIOGRAPHY

[01] U.S. Pat. No. 8,965,468 B2
[02] Y. Iwasa et al. "Persistent-mode high-temperature superconductor shim coils: A design concept and experimental results of a prototype Z1 high-temperature superconductor shim" Appl. Phys. Lett. 103, 052607 (2013)
[03] DE 10 2016 225 017 A1
[04] U.S. Pat. No. 9,671,479 B2
[05] T. A. Coombs et al. "Flux pumps for HTS coils" MAGNETICS TECHNOLOGY INTERNATIONAL 2017, S. 44-49
[06] J. Geng et al. "Mechanism of a high-Tc superconducting flux pump: Using alternating magnetic field to trigger flux flow", S. 1-4 APPLIED PHYSICS LETTERS 107, 142601 (2015)
[07] S. Lee et al. "Persistent Current Mode Operation of A 2G HTS Coil With A Flux Pump" IEEE TRANSACTIONS ON APPLIED SUPERCONDUCTIVITY, VOL. 26, NO. 4, June 2016
[08] C. W. Bumby et al. "Through-Wall Excitation of a Magnet Coil by an External-Rotor HTS Flux Pump" IEEE TRANSACTIONS ON APPLIED SUPERCONDUCTIVITY, VOL. 26, NO. 4, June 2016
[09] WO 2007/004787 A2
[10] D. Park et al. "HTS Shim Coils Energized by a Flux Pump for the MIT 1.3-GHz LTS/HTS NMR Magnet: Design, Construction, and Results of a Proof-of-Concept Prototype" IEEE TRANSACTIONS ON APPLIED SUPERCONDUCTIVITY, VOL. 28, NO. 3, April 2018
[11] GB 2 424 284 A
[12] U.S. Pat. No. 9,810,755 B2
[13] DE 10 2015 218 019 A1

What is claimed is:

1. A method for charging a high-temperature superconductor (HTS) shim device of a superconducting magnet coil system arranged in a cryostat having a room temperature bore with a charging device, the HTS shim device comprising at least one superconductingly closed HTS shim conductor path (C, $C_1$, ..., $C_n$) and a shim switch (S, $S_1$, ..., $S_n$) configured to temporarily interrupt the superconducting state in a section of the HTS shim conductor path,
wherein the charging device comprises at least one normal-conducting charging coil (P, $P_1$, ..., $P_m$), at least one power supply and supply lines and forms at least one primary circuit, and the HTS shim device forms at least one secondary circuit, and wherein a change in electric current in the secondary circuit inductively occurs through a change of magnetic flux generated by the charging coil (P, $P_1$, ..., $P_m$) through the surface enclosed by the HTS shim conductor path (C, $C_1$, ..., $C_n$), wherein the method comprises:

in a first phase (Ph1) in any order, at least temporarily opening the shim switch (S, $S_1$, ..., $S_n$) for interrupting the superconducting state in a section of the HTS shim conductor path (C, $C_1$, ..., $C_n$), positioning the charging coil (P, $P_1$, ..., $P_m$) in the room temperature bore of the cryostat, and carrying out at least a change of the electric current in the primary circuit;

in a second phase (Ph2) superconductingly closing the HTS shim conductor path (C, $C_1$, ..., $C_n$) by closing the shim switch (S, $S_1$, ..., $S_n$); and in a third phase (Ph3), with the shim switch (S, $S_1$, ..., $S_n$) closed, at least one of: changing the electric current in the primary circuit, and removing the charging coil (P, $P_1$, ..., $P_m$) from the room temperature bore.

2. A method according to claim 1, further comprising:
in the first phase (Ph1) for adjusting the electric current in the primary circuit, increasing the electric current in the primary circuit, and for adjusting the electric current in the primary circuit in the third phase (Ph3), reducing the electric current in the primary circuit.

3. A method according to claim 2, further comprising:
in order to discharge the secondary circuit in the first phase (Ph1) in the case of a superconductingly short-circuited secondary circuit, setting the electric current in the charging coil (P, $P_1$, ..., $P_m$) so that the electric current in the secondary circuit drops to 0.

4. A method according to claim 1, wherein in the first phase (Ph1) at least one of the changes of the electric current in the primary circuit takes place after the shim switch (S, $S_1$, ..., $S_n$) is opened.

5. A method according to claim 1, wherein the HTS shim device comprises n>1 HTS shim conductor paths ($C_1$, ..., $C_n$) which each form a secondary circuit with a shim switch ($S_1$, ..., $S_n$), further comprising:

inductively coupling the HTS shim conductor paths ($C_1$, ..., $C_n$) of the secondary circuits, predetermining a sequence of switch openings and switch closures of the shim switches ($S_1$, ..., $S_n$) of the secondary circuits and a sequence of changes in the electric current in the primary circuit, performing a change in the electric current in the primary circuit—within the predetermined sequence of switch closures—after a last closure of the shim switch ($S_1$, ..., $S_n$) of each secondary circuit, calculating extents of the changes in the electric current to be performed in the primary circuit for the predetermined sequence of processes such that the sum of all the currents induced by the changes in the electric current in the primary circuit and by the switch openings corresponds to a target current in each secondary circuit, wherein the inductive couplings between the HTS shim conductor paths ($C_1$, ..., $C_n$) with one another and between the charging coil (P, $P_1$, ..., $P_m$) and the HTS shim conductor paths ($C_1$, ..., $C_n$) are taken into account.

6. A method according to claim 5, further comprising, after the shim switch ($S_1$, ..., $S_n$) of a secondary circuit has been closed for a last time within the sequence, performing a change in the electric current in the primary circuit before the shim switch ($S_1$, ..., $S_n$) of another secondary circuit within the sequence is closed for a last time.

7. A method according to claim 5 further comprising, within the sequence, first closing the shim switches ($S_1$, ..., $S_n$) of those secondary circuits for the last time, whose HTS shim conductor paths ($C_1$, ..., $C_n$) are inductively coupled with other HTS shim conductor paths ($C_1$, ..., $C_n$) to the least strong degree.

8. A method according to claim 5, further comprising performing the changes in the electric current in a plurality of primary circuits with m>1 different charging coils ($P_1$, ..., $P_m$), which are inductively coupled with the HTS shim conductor paths ($C_1$, ..., $C_n$).

9. A magnet arrangement for carrying out the method according to claim 1, wherein the magnet arrangement comprises:

a cryostat having a room temperature bore;

a superconducting magnet coil system arranged in the cryostat with a main magnet and with an HTS shim device with at least one HTS shim conductor path (C, $C_1$, ..., $C_n$) for adjusting the spatial profile and/or for spatially homogenizing a magnetic field generated by the magnet coil system in a working volume, wherein the HTS shim conductor path (C, $C_1$, ..., $C_n$) is configured as an HTS coil having a winding number 0 around a main magnet longitudinal axis which is configured to be short circuited superconductingly, wherein the HTS shim device comprises a shim switch (S, $S_1$, ..., $S_n$) for temporarily interrupting the superconducting state in a section of the HTS shim conductor path(C, $C_1$, ..., $C_n$), and a charging device comprising:
at least one normal-conducting charging coil (P, $P_1$, ..., $P_m$), at least one power supply and supply lines, which together form at least one primary circuit, wherein the charging coil (P, $P_1$, ..., $P_m$) is configured to be arranged at least temporarily in the room temperature bore of the cryostat, wherein the HTS shim conductor path (C, $C_1$, ..., $C_n$) and the shim switch (S, $S_1$, $S_n$) form a secondary circuit, and wherein the charging coil (P, $P_1$, ..., $P_m$) and the HTS shim conductor path (C, $C_1$, ..., $C_n$) are adapted to inductively couple with each other.

10. A magnet arrangement according to claim 9, wherein a current transfer ratio $|M/L_s|$ between the charging coil (P, $P_1$, ..., $P_m$) and the HTS shim conductor path (C, $C_1$, ..., $C_n$) is ≥0.01, wherein M designates a mutual inductance between the charging coil (P, $P_1$, ..., $P_m$) and the HTS shim conductor path (C, $C_1$, ..., $C_n$) and $L_s$ designates a self-inductance of the HTS shim conductor path (C, $C_1$, ..., $C_n$).

11. A magnet arrangement according to claim 10, wherein the current transfer ratio $|M/L_s|$≥1.

12. A magnet arrangement according to claim 9, wherein the charging coil (P) has a charging coil longitudinal axis (a) which, at least in the third phase, is aligned in parallel to the main magnet longitudinal axis (z).

13. A magnet arrangement according to claim 12, wherein the charging coil longitudinal axis (a), at least in the third phase, is aligned coaxially to the main magnet longitudinal axis (z).

14. A magnet arrangement according to claim 9, wherein the HTS shim device comprises a plurality of secondary circuits, wherein the HTS shim conductor paths ($C_1, \ldots, C_n$) of at least two different secondary circuits are adapted to inductively couple with a single charging coil ($P, P_1, \ldots, P_m$).

15. A magnet arrangement according to claim 14, wherein the HTS shim conductor paths ($C_1, \ldots, C_n$) of at least two further different secondary circuits are adapted to inductively couple with a further single charging coil ($P, P_1, \ldots, P_m$).

16. A magnet arrangement according to claim 9, wherein the HTS shim device comprises a plurality of secondary circuits and the charging device comprises a plurality of charging coils ($P_1, \ldots, P_m$), wherein the different charging coils ($P_1, \ldots, P_m$) are adapted to inductively couple with different HTS shim conductor paths ($C_1, \ldots, C_n$) of the various secondary circuits.

17. A magnet arrangement according to claim 9, wherein the charging device comprises a magnetic field sensor which is arranged radially inside the charging coil ($P, P_1, \ldots, P_m$).

18. A magnet arrangement according to claim 9, wherein the shim switch ($S, S_1, \ldots, S_n$) comprises an electric heating element configured to induce a heating current through inductive coupling with a primary coil in the room temperature bore of the cryostat.

* * * * *